United States Patent [19]

Weinstein

[11] Patent Number: 4,765,187
[45] Date of Patent: Aug. 23, 1988

[54] LIQUID THICKNESS GAUGE

[75] Inventor: Leonard M. Weinstein, Newport News, Va.

[73] Assignee: The United States of America as represented by the Administrator of the National Aeronautics and Space Administration, Washington, D.C.

[21] Appl. No.: 102,705

[22] Filed: Sep. 30, 1987

Related U.S. Application Data

[63] Continuation-in-part of Ser. No. 890,982, Jul. 30, 1986, abandoned, which is a continuation-in-part of Ser. No. 684,186, Dec. 20, 1984, abandoned.

[51] Int. Cl.$^4$ .............................................. G01F 23/00
[52] U.S. Cl. .................................. 73/304 R; 73/290 R
[58] Field of Search .................... 73/171, 290 R, 304, 73/304 C, 336.5; 324/65 P, 65 CR, 61 R, 61 P; 338/27, 80, 94, 151, 156, 222; 340/602, 620

[56] References Cited

U.S. PATENT DOCUMENTS

| | | |
|---|---|---|
| 2,977,797 | 4/1961 | Karl-Heinz Hoffmann et al. ............................ 73/304 R |
| 3,186,224 | 6/1965 | Mair ................................ 73/304 R |
| 3,422,677 | 1/1969 | Lockwood ....................... 73/336.5 |
| 3,695,108 | 10/1972 | Wygant ............................ 73/290 R |
| 3,855,861 | 12/1974 | Zimmermann et al. ......... 73/304 R |
| 3,861,212 | 1/1975 | Henry .............................. 73/304 R |
| 3,873,927 | 3/1975 | Overall ............................ 324/61 R |
| 3,905,236 | 9/1975 | Henry .............................. 73/304 R |
| 3,986,110 | 10/1976 | Overall et al. .................. 324/61 R |

OTHER PUBLICATIONS

NASA Technical Memorandum 85796 "Preliminary Indications of Water Film Distribution and Thickness on an Airfoil in a Water Spray", Earl C. Hastings, Jr., and Leonard M. Weinstein, Jul. 1984.

J. Mikielewicz and F. G. Hammitt, Generalized Characteristics of Electrical conductance Film Thickness Gauges, Report No. Umich 012449-7-I, Michigan University, Dec. 1974.

Primary Examiner—William A. Cuchlinski, Jr.
Assistant Examiner—W. Morris Worth
Attorney, Agent, or Firm—George F. Helfrich; John R. Manning; Charles E. B. Glenn

[57] ABSTRACT

A method and apparatus to measure the thickness of liquid 12 on a surface 14 independent of liquid conductivity. Two pairs of round, corrosion resistant wires, 18 and 20, are mounted in an insulating material 16 such that the cross-sectional area of each wire is flush with and normal to the surface 14. The resistance between each pair of wires 18 and 20 is measured using two AC resistance measuring circuits 22 and 24 wherein the ratio of the outputs of the two resistance measuring circuits is indicative of the thickness of the liquid 12 on the surface 14.

3 Claims, 2 Drawing Sheets

LIQUID THICKNESS GAUGE

ORIGIN OF THE INVENTION

The invention described herein was made by an employee of the U.S. Government and may be manufactured and used by or for the Government for governmental purposes without the payment of any royalties thereon or therefor.

This application is a continuation-in-part of co-pending application, Ser. No. 890,982, filed July 30, 1986 and now abandoned, which is a continuation-in-part of application 684,186, filed Dec. 20, 1984 and now abandoned.

BACKGROUND OF THE INVENTION

This invention relates generally to gauges and more particularly to water or other liquid thickness gages.

Previous methods and apparatus that can be used to measure water or other liquid thickness include fiber optic sensors, acoustic wave sensors and microwave sensors. These prior art devices are either limited in range, complex, or expensive. A prior art single resistance sensor is a simple and inexpensive device for measuring water thickness. However, its measurements are dependent on water conductivity. Consequently, when the conductivity of the water varies there is an error in the measurements. This makes the single resistance sensor unsuitable for many applications.

It is therefore an object of this invention to modify the water thickness measurements made by single resistance sensors such that the measurements are not dependent on water conductivity.

Another object of this invention is to provide a simple, inexpensive method and apparatus for measuring the thickness of a liquid on a surface that is independent of the liquid conductivity.

Other objects and advantages of this invention will become apparent hereinafter in the specification and drawings.

SUMMARY OF THE INVENTION

The present invention involves a method and device for measuring the thickness of water on a surface independent of water conductivity. Two pairs of different diameter wire are mounted in an insulating material such that the cross-sectional area of each wire is flush with and normal to the surface. The effect of change in resistance between each pair of wires is measured using two AC resistance measuring circuits wherein the ratio of the measured voltages produced is indicative of the thickness of water on the surface.

DESCRIPTION OF THE PREFERRED EMBODIMENT

Figure 1:
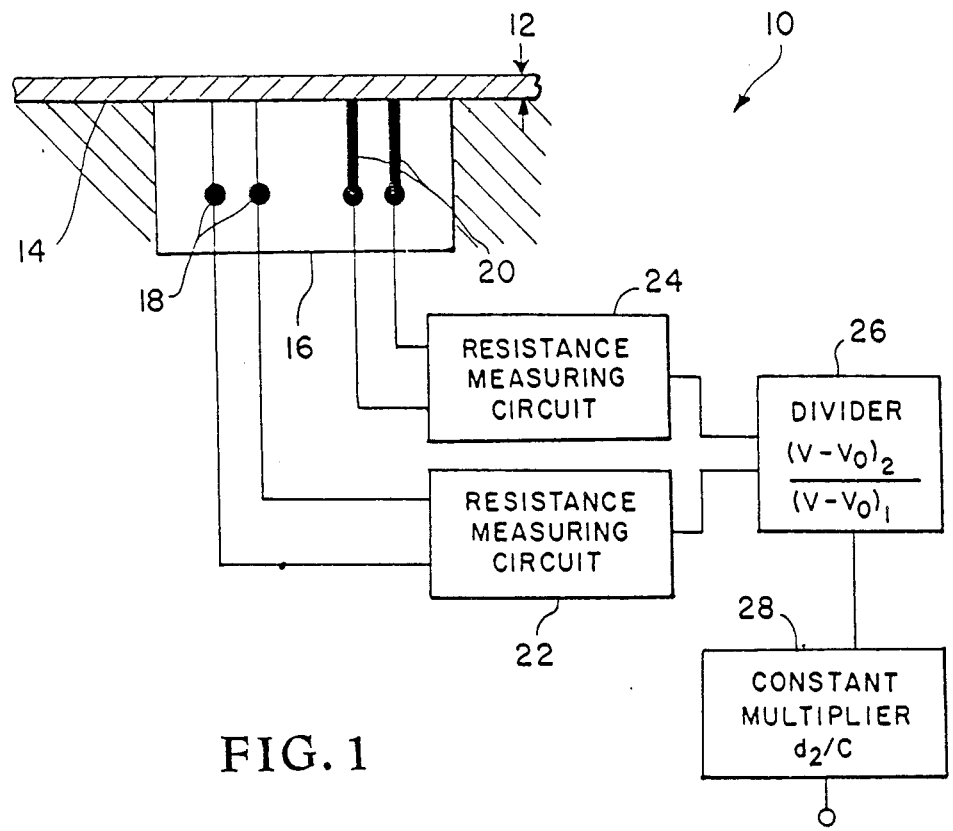
FIG. 1 is a block diagram of the invention.

Referring to FIG. 1, a cross-sectional view of the water thickness gauge 10 is shown. The invention includes two pairs of round, corrosion resistant wire; one pair of smaller diameter wires 18 and one pair of larger diameter wires 20, mounted such that the cross-sectional area of each wire is flush with and normal to the surface 14. Wires 18 and 20 are preferably platinum or some other very stable material. Insulating material 16 serves as a suitable means for holding the two pairs of wires 18 and 20 flush with and normal to the surface 14. Each pair of wires 18 and 20 is connected within insulating material 16 to an AC resistance measuring circuit 22 and 24.

Figure 2:
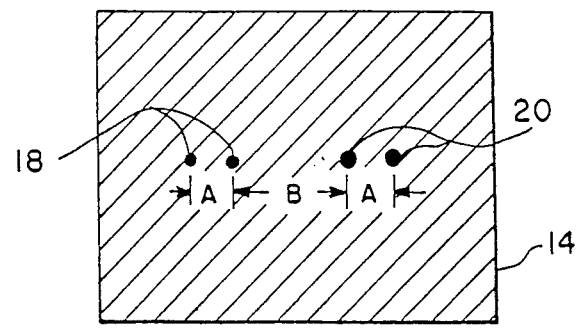
FIG. 2 is a top view of a portion of the surface showing the exposed surface area of each pair of round, corrosion resistant wires.

A top view of the cross-sectional surface area of the two pairs of round, corrosion resistant wire 18 and 20 exposed to the surface 14 is shown in FIG. 2. The exposed cross-sectional surface area of each wire is flush with and normal to the surface 14 such that water only touches the exposed portion of each corrosion resistant wire. In a particular embodiment of the invention, the wires 18 have diameters of 0.001 inch, wires 20 have diameters of 0.020 inch, dimension A is $\frac{1}{8}$-inch and dimension B is $\frac{1}{8}$-inch.

The pair of wires 18 is connected to a resistance measuring circuit 22 and the pair of wires 20 is connected to a resistance measuring circuit 24. The outputs of resistance measuring circuits 22 and 24 are connected to a divider 26 which divides the output of circuit 24 by the output of circuit 22. The output of divider 26 is multiplied by a constant by means of a constant multiplier 28. The computing elements 26 and 28 can be either analog or digital in which case divider 26 must include two analog-to-digital converters. Also, the computing specified in blocks 26 and 28 can be done by hand without departing from the invention.

Figure 3:
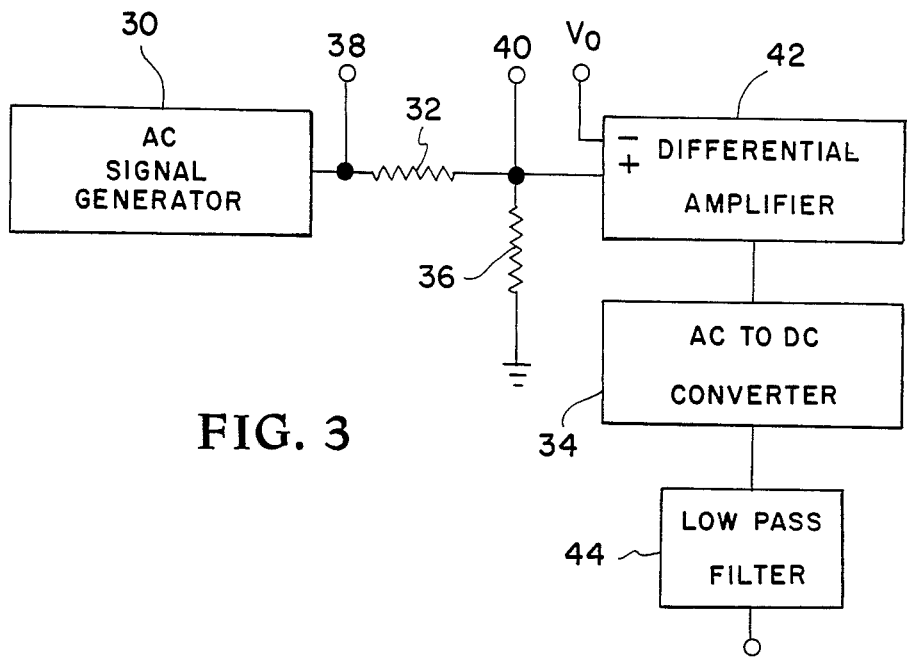
FIG. 3 is a block diagram of an AC resistance measuring circuit suitable for use as the resistance measuring circuits in FIG. 1.

An AC resistance measuring circuit (AC is used to prevent electrolysis or polarization) suitable for use as each of the resistance measuring circuits 22 and 24 is shown in FIG. 3. An AC signal generator 30 applies an AC signal to a resistance network consisting of resistors 32 and 36. Either wire pairs 18 or 20 are connected to terminals 38 and 40 which are connected across resistor 32. The output of voltage across resistor 36 of the resistance network is amplified by a differential amplifier 42 and then passed through an AC to DC converter 34 then low pass filter 44 to give a smoothed DC output. The $V_o$ connected to the negative input of differential amplifier is an offset voltage that is equal to the output of resistor 36 of the circuit when surface 14 is dry. The $V_o$ can be supplied by a variable voltage that is varied until the output of low pass filter 44 is zero while the surface 14 is dry and then the voltage $V_o$ remains constant while the measurements are being made.

In describing the operation of the resistance measuring circuit in FIG. 3 when it is connected to one of the wire pairs, it will first be assumed that the surface 14 is dry. Hence, the resistance between terminals 38 and 40 is the resistance of resistor 32: with a dry surface 14 the resistance between the wire pair ends across the surface is essentially infinite. For this condition the output of low pass filter is zero because of the offset $V_o$. With water on the surface 14, there will be a finite resistance between wire pair ends across the surface thereby reducing the resistance between terminals 38 and 40. The change in resistance will cause a change in the output of low pass filter 44. This output will be referred to as $(V-V_o)$. When the depth of the water 12 on surface 14 becomes thick relative to the diameter of the wire pair the output will become essentially constant with increased thickness. This output will be referred to as $(V_t-V_o)$.

The measurement of resistance in water is actually a measure of current, due to ion migration, for a given voltage. It is known that for thin liquid films, the electric current, on the voltage output of the gauges, depends on gauge geometry (diameter) and the conductivity of the liquid. See J. Mikielwitz et al., *Generalized Characteristics of Electrical Conductance Film Thickness Gauges*, National Science Foundation, December 1974.

Figure 4:
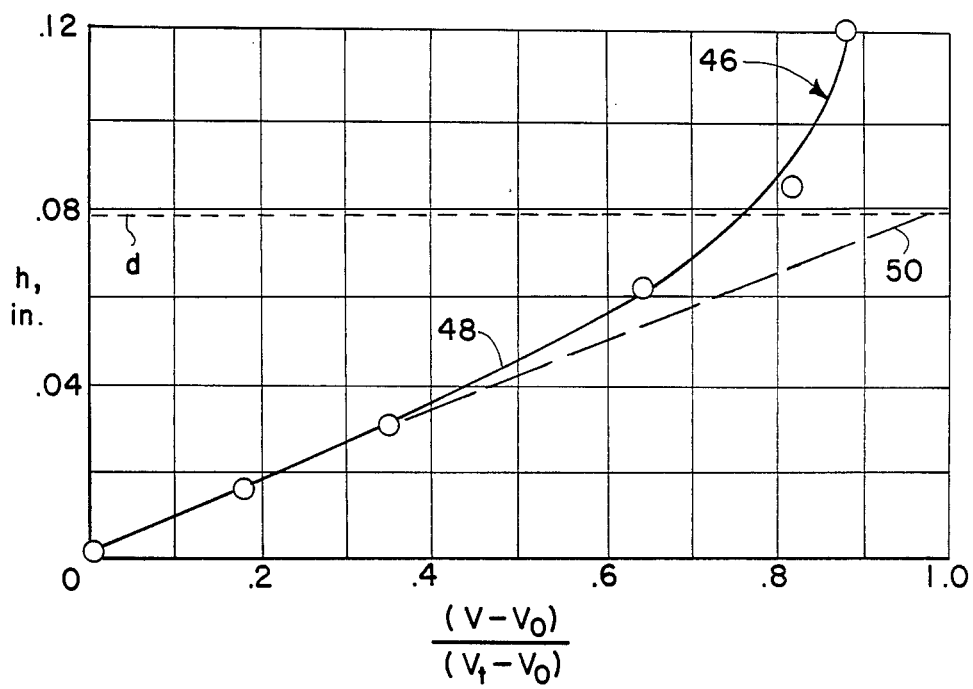
FIG. 4 is an experimentally derived calibration curve showing the relationships between the voltages indicated by the resistance measuring circuit and the thickness of the water on the surface.

The ion migration is limited either by the wetted area of the wires, or by the water thickness (if it is small compared to the wire diameter). Specifically, if the wire diameter is small with respect to the thickness of the water, ion migration is limited by the wire diameter. However, if the wire diameter is large with respect to the thickness of the water, ion migration is limited by the thickness of the water. This is due to the fact that ion migration between the wires takes place through a cross-section of liquid surrounding the wires. The cross-sectional area of the path is the cross-sectional area of the wire if the wire diameter is small with respect to the thickness of the water. However, the cross-sectional area of the path is proportional to the thickness of the water if the wire diameter is large with respect to the thickness of the water. Thus, the water thickness does not act as a bulk resistor affecting both wire pairs 18 and 20 equally, but instead limits the ion migration between the larger diameter wire pair 20 while the ion migration between the smaller diameter wire pair 18 is limited by the wire diameter. This accounts for the difference between resistance measuring circuits 22 and 24 for the same water thickness. Referring to FIG. 4, the experimentally determined calibration curve 46 for a single pair of wires is shown as a plot of $(V-V_o)$ divided by $(V_t-V_o)$ versus water thickness, h. The linear portion 48 of curve 46 is extended with a dotted line to the $(V-V_o)/(V_t-V_o)=1$ line. The resulting intercept 50 is a water thickness approximately equal to the diameter d of the wire. The wire pair used in this experiment had a diameter of 5/64 of an inch. It is clear that the thickness of the liquid is equal to the product of the diameter of the wire and the ratio of $(V-V_o)/(V_t-V_o)$ for the linear portion 48, which corresponds to a water thickness less than the diameter. The results of this experiment are reported in E. C. Hastings, Jr. and L. Weinstein, *Preliminary Indications of Water Film Distribution and Thickness on an Airfoil in a Water Spray*, NASA Technical Memorandum 85796, July, 1984.

In the operation of the embodiment of the invention shown in FIG. 1, good results are obtained when the thickness of the water 12 is greater than the diameter $d_1$ of wires 18 and less than approximately 0.7 of the diameter $d_2$ of wires 20. For water thickness down to approximately 0.7 $d_1$, good results can still be obtained by correcting results with the calibration curve and the ratio will be unchanged. First, a measurement is made at the output of divider 26 when the water thickness 12 is greater than $d_2$ to obtain a constant C. C is a circuit constant determined by the voltage used and the type of resistors used for resistors 32 and 36. Hence, $$(V_t - V_o)_2/(V_t - V_o)_1 = C \quad (1)$$

therefore $$\frac{1}{C(V_t - V_o)_1} = \frac{1}{(V_t - V_o)_2}. \quad (2)$$

Now assume that operation is in the normal operating range. That is, the thickness of the water is greater than $d_1$ and less than approximately 0.7 $d_2$. Then for the sensor wires 20

$$h \approx d_2[(V-V_o)/(V_t-V_o)]_2 \quad (3)$$

because operation is in the linear portion of the calibration curve. This relation has been shown experimentally (see FIG. 5 and discussion above). Using equations (2) and (3)

$$h \approx \frac{d_2}{C}\left[\frac{(V-V_o)_2}{(V_t-V_o)_1}\right]. \quad (4)$$

Since the sensor wires 18 are operating where $$(V-V_o)_1/(V_t-V_o)_1 \approx 1, \quad (5)$$

we have $$(V-V_o)_1 \approx (V_t-V_o)_1. \quad (6)$$

Combining equations (4) and (6)

$$h \approx \frac{d_2}{C}\left[\frac{(V-V_o)_2}{(V-V_o)_1}\right]. \quad (7)$$

The constant ratio $d_2/C$ is used to scale the output of multiplier 28.

For the AC resistance measuring circuit 22 and 24 shown in FIG. 3:

$$V = V_s\left[\frac{R_{36}}{R_{36} + \frac{1}{\left(\frac{1}{R_{32}} + \frac{1}{R_w}\right)}}\right] \quad (8)$$

where $V_s$ is the RMS supply, $R_w$ is the resistance of the water, $R_{32}$ is the resistance measured across resister 32, and $R_{36}$ is the resistance measured across resistor 36. Also, $$V_o = V_s\left[\frac{R_{36}}{R_{36} + R_{32}}\right] \quad (9)$$

Combining equations (8) and (9), we have $$(V-V_o) = V_s\left[\frac{R_{36}}{R_{36} + \frac{1}{\left(\frac{1}{R_{32}} + \frac{1}{R_w}\right)}} - \frac{R_{36}}{R_{36}+R_{32}}\right] \quad (10)$$

For $R_{36}$ much smaller than $R_{32}$ and $R_w$, we obtain $$(V - V_o) \simeq V_s \left[ \frac{R_{36}}{1 \cdot \left(\frac{1}{R_{32}} + \frac{1}{R_w}\right)} - \frac{R_{36}}{R_{32}} \right], \quad (11)$$

or $$(V - V_o) \simeq V_s \left[ \frac{R_{36}}{R_{32}} + \frac{R_{36}}{R_w} - \frac{R_{36}}{R_{32}} \right], \quad (12)$$

or $$(V - V_o) \simeq V_s \left( \frac{R_{36}}{R_w} \right) \quad (13)$$

Thus, $$(V - V_o) \propto \frac{1}{R_w}. \quad (14)$$

Equation (7) gives the relationship of water thickness h to the ratio of $(V-V_o)_2$ and $(V-V_o)_1$. Now assume the conductivity of layer 12 is changing. According to equation (14), $(V-V_o)$ is inversely proportional to the conductivity of the water. Thus, if the conductivity of the water changes, then the ratio of $(V-V_o)_2/(V-V_o)_1$ of equation (7) will be unchanged since both $(V-V_o)_2$ and $(V-V_o)_1$, will reflect the change of conductivity. This change can be assumed to be the same for both measurements since the two pairs of wire are close to each other on surface 14. Hence, equation (7) results in a measurement of water thickness only. $(V-V_o)_1$ does not change with changing water thickness h because h is in the region above d which is essentially constant (see FIG. 4 and discussion above). However, $(V - V_o)_1$ does change with changing conductivity and $(V-V_o)_2$ changes with both. Thus, the ratio changes only with changing water thickness.

An alternate embodiment of the present invention might use several pairs of wires with a wide range of sizes to provide measurement capability over a range of thicknesses.

The advantages of the present invention are numerous. It is especially useful as a water thickness gauge operating independently of water conductivity which can vary greatly. Additionally, the invention accurately measures the thickness of water on the outside of an airplane in a simple and inexpensive manner. A linear relationship between output voltage and thickness is developed during the calibration process thereby making voltage indicative of water thickness.

The above description and drawings are only illustrative of a preferred embodiment which achieves the objects, features, and advantages of the present invention, and it is not intended that the present invention be limited thereto. Any modifications that come within the spirit and scope of the following claims are considered part of the present invention.

What is claimed as new and desired to be secured by Letters Patent of the United States is:

1. A method for measuring the thickness h of a desired liquid on a surface independent of the liquid conductivity comprising:
    (a) a preliminary, once-performed operation which comprises:
    providing a first pair of wires having a diameter $d_1$;
    providing a second pair of wires having a diameter $d_2$ which is greater than $d_1$;
    mounting said first and second pairs of wires flush with and normal to said surface which is dry:
    connecting said first pair of wires to a first AC resistance measuring circuit which is supplied with a voltage and produces a voltage output:
    connecting said second pair of wires to a second AC resistance measuring circuit which is supplied with a voltage and produces a voltage output;
    obtaining an offset voltage for said first circuit by varying another voltage supplied to said first circuit until said output voltage of said first circuit is zero in the absence of water;
    obtaining an offset voltage for said second circuit by varying another voltage supplied to said second circuit until said output voltage of said second circuit is zero in the absence of water;
    providing said liquid having a thickness greater than $d_2$ on said surface;
    obtaining the voltage output of each of said first and second circuits;
    obtaining a circuit constant C from the following equation:

$$C = \frac{(V_t - V_o)_2}{(V_t - V_o)_1}$$

where $V_{t1}$ and $V_{t2}$ are the respective voltage outputs of said first and second circuits when said liquid of thickness greater than $d_2$ is on said surface, and $V_{o1}$ and $V_{o2}$ are the respective offset voltages of said first and second circuits when said surface was dry:
    which said preliminary operation is followed by:
    (b) an operation for determining the thickness h of said liquid as many times as desired which comprises:
    allowing said surface to be covered by said liquid having a thickness h greater than $d_1$ and less that 0.7 $d_2$;
    obtaining the voltage output of each of said first and second circuits;
    calculating the thickness of the liquid on said surface from the following equation:

$$h \simeq \frac{d_2}{C} \frac{(V - V_o)_2}{(V - V_o)_1}$$

where h is the thickness of the liquid and $V_1$ and $V_2$ are the respective voltage outputs of said first and second circuits.

2. A device for measuring the thickness h of a desired liquid on a surface independent of the liquid conductivity comprising:
    a first pair of wires having a diameter $d_1$;
    a second pair of wires having a diameter $d_2$ which is greater than $d_1$;
    said first and second pairs of wires being mounted flush with and normal to said surface which is dry;
    a first AC resistance measuring circuit to which said first pair of wires is connected which produces a voltage output:
    a second AC resistance measuring circuit to which said second pair of wires is connected which produces a voltage output;

a means for obtaining an offset voltage for said first circuit by varying another voltage supplied to said first circuit until said output voltage of said first circuit is zero;

a means for obtaining an offset voltage for said first circuit by varying another voltage supplied to said second circuit until said output voltage of said first circuit is zero;

a means for obtaining the voltage output of each of said first and second circuits;

a means for calculating a circuit constant C from the following equation:

$$C = \frac{(V_t - V_o)_2}{(V_t - V_o)_1}$$

where $V_{t1}$ and $V_{t2}$ are the respective voltage outputs of said first and second circuits when said liquid on said surface has a thickness greater than $d_2$ and $V_{o1}$ and $V_{o2}$ are the respective offset voltages of said first and second circuits when said surface was dry;

said surface being covered by said liquid, wherein said liquid has a thickness greater than $d_1$ and less that 0.7 $d_2$;

a means for calculating the thickness h of the liquid on said surface from the following equation:

$$h \approx \frac{d_2}{C} \frac{(V - V_o)_2}{(V - V_o)_1}$$

where h is the thickness of the liquid and $V_1$ and $V_2$ are the respective voltage outputs of said first and second circuits when said liquid on said surface has a thickness greater than $d_1$ and less than 0.7 $d_2$.

3. The device of claim 2 wherein both wire pairs are composed of platinum.

* * * * *